United States Patent [19]

Ivankovits et al.

[11] Patent Number: 5,213,621
[45] Date of Patent: May 25, 1993

[54] HALOGENATED CARBOXYLIC ACID CLEANING AGENTS FOR FABRICATING INTEGRATED CIRCUITS AND A PROCESS FOR USING THE SAME

[75] Inventors: John C. Ivankovits, Allentown; David A. Bohling, Emmaus, both of Pa.; David A. Roberts, Carlsbad, Calif.

[73] Assignee: Air Products and Chemicals, Inc., Allentown, Pa.

[21] Appl. No.: 777,821

[22] Filed: Oct. 11, 1991

[51] Int. Cl.$^5$ ............................................... C23G 1/02
[52] U.S. Cl. ......................................... 134/3; 134/41; 252/142
[58] Field of Search ........................................ 134/3, 41

[56] References Cited

U.S. PATENT DOCUMENTS 5,051,134  9/1991  Schnegg et al. ..................... 134/3
5,106,454  4/1992  Allardyee et al. .................. 134/3 X

*Primary Examiner*—Patrick P. Garvin
*Attorney, Agent, or Firm*—Keith D. Gourley; James C. Simmons; William F. Marsh

[57] ABSTRACT

This invention is a vapor-phase process for cleaning metal-containing contaminants from the surfaces of integrated circuits and semiconductors between the numerous fabricating steps required to manufacture the finished electronic devices. The process employs cleaning agents comprising an effective amount of a partially halogenated or fully halogenated linear or branched carboxylic acid having from 2 to about 10 carbon atoms wherein the halogen is selected from fluorine or chlorine. The process comprises contacting the surface to be cleaned with an effective amount of the desired cleaning agent at a temperature sufficient to form volatile metal-ligand complexes on the surface of the substrate to be cleaned. The volatile metal-ligand complexes are sublimed from the surfaces of the substrate providing a clean, substantially residue-free surface.

21 Claims, 1 Drawing Sheet

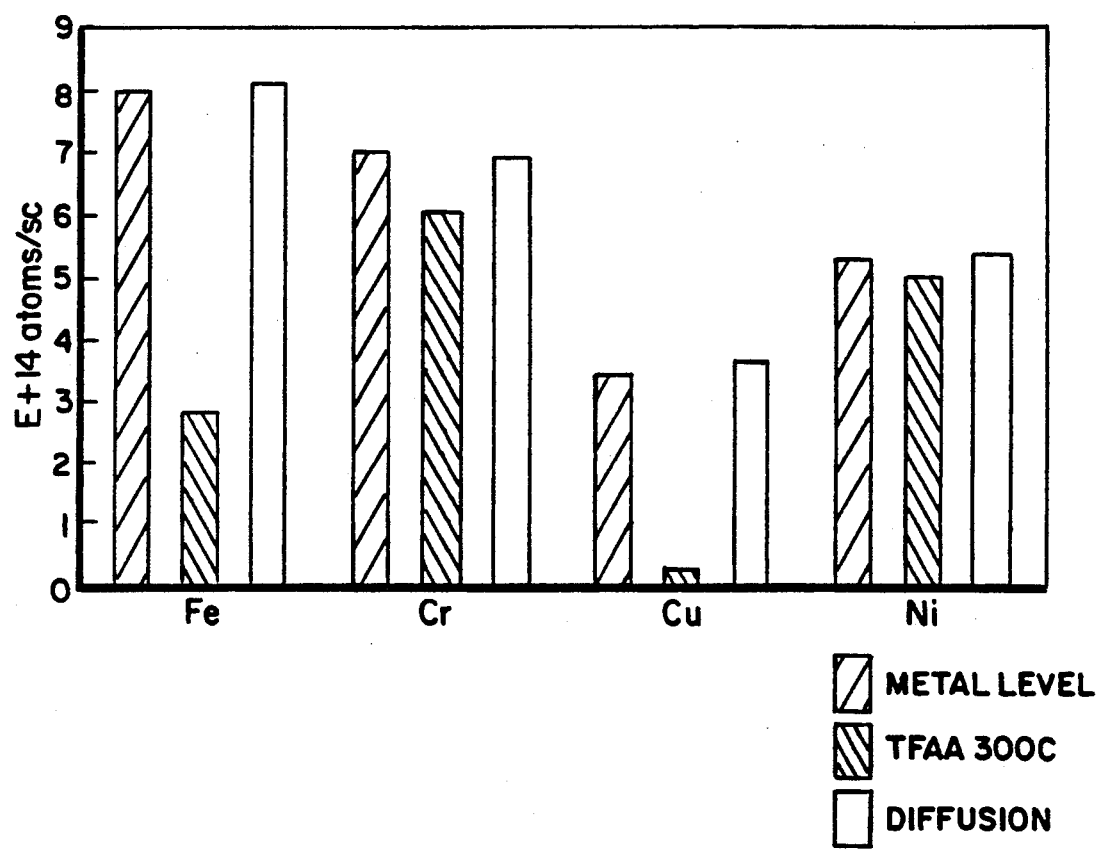

HALOGENATED CARBOXYLIC ACID CLEANING AGENTS FOR FABRICATING INTEGRATED CIRCUITS AND A PROCESS FOR USING THE SAME

TECHNICAL FIELD

The present invention relates to cleaning agents used in fabricating semiconductors and integrated circuits and a substantially residue-free vapor-phase process for using the cleaning agents. The cleaning agents comprise an effective amount of a partially halogenated or fully halogenated linear or branched carboxylic acid having from 2 to about 10 carbon atoms wherein the halogen is fluorine or chlorine.

BACKGROUND OF THE INVENTION

The electronics industry is striving to further miniaturize semiconductors and integrated circuits while increasing design complexity. To accomplish that result, the individual active electrical devices such as transistors, diodes and the like used to create the circuitry and the interconnects between such devices must be fabricated on an increasingly small scale. As circuitry dimensions decrease, contaminants present during the fabrication of electronic devices cause significantly more device failures and malfunctions. Therefore, surface contaminants must be carefully removed to maintain quality standards and to maximize the yield of fully functioning integrated circuits.

Contaminants present during integrated circuit fabrication include photoresist materials, residual organic and metallic contaminants such as alkali metals and native/metallic oxides. Metallic films comprising metal oxides and metal halides are also inadvertently deposited onto electronic devices during immersion into etchant or resist stripper baths, both which may contain metal ions and free metals in solution. Likewise, corrosive chlorides are deposited on to such assemblies through various handling operations and plasma etching processes. These through various handling operations and plasma etching processes. These contaminants can weaken or embrittle the electrical connectors of the device as well as to delaminate the layers of the device resulting in current leakages or physical failure.

Chemical cleaning agents are typically used to remove bonded or adsorbed metallic oxides and corrosive chloride residues from wafer surfaces between the numerous individual steps required to fabricate an integrated circuit. Conventional chemical cleaning is typically performed using a series of acid and rinse baths. These cleaning methods are often characterized as "wet" techniques because the electronic device is immersed in a liquid cleaning solution immediately prior to performing the next processing step. Numerous problems are encountered when using liquid cleaning solutions including incomplete removal of the cleaning agent from the surface, introducing new contaminants onto the surface to be cleaned as well as disposing of hazardous liquid wastes.

A typical wet cleaning process for removing film contaminants from a bare silicon or thermally grown silicon oxide crystal comprises the steps of:

(1) immersing the wafer in an inorganic resist stripper such as sulfuric acid/hydrogen peroxide followed by immersing in a sulfuric acid/oxidant mixture and rinsing with deionized water;

(2) immersing the wafer into a mixture of water/ammonium hydroxide/hydrogen peroxide to remove metal oxides and metals followed by rinsing with deionized water;

(3) immersing the still wet wafers into a mixture of water/hydrochloric acid/hydrogen peroxide to desorb atomic and ionic contaminants; and The above mentioned "wet" cleaning process suffers from numerous problems: First, ammonia and HCl vapors can mix to form particulate smoke containing colloidal ammonium chloride particles which can cause wafer contamination. Special care must also be taken to prevent depletion of hydrogen peroxide from the cleaning solution of step (2) because ammonium hydroxide in the absence of hydrogen peroxide acts as a silicon etchant. Additional contaminants may also be introduced into the system during the numerous distilled water rinsing steps required to remove cleaning residue. Finally, trace moisture must be removed, typically via high temperature vacuum applications, before conducting the next processing step.

Disadvantages associated with wet wafer cleaning processes have led to a search for "dry" cleaning processes wherein the cleaning agent is applied and removed in the vapor state. In order to conduct a vapor phase cleaning process, the products formed by contacting the cleaning agent and the contaminants must possess sufficient volatility to enable essentially complete removal from the surface to be cleaned. Manufacturers are continually searching for "dry" cleaning agents and vapor-phase processes for using such cleaning agents which eliminate the enumerated problems wherein high quality electronic devices can be fabricated without using environmentally harmful reagents.

BRIEF SUMMARY OF THE INVENTION

The present invention is a vapor-phase process for cleaning metal-containing contaminants from the surfaces of integrated circuits and semiconductors between the numerous individual fabricating steps required to form the finished electronic device. The process for removing metal-containing contaminants residing on the surfaces of the electronic device comprises contacting the surface to be cleaned with an effective amount of one or a mixture of the enumerated cleaning agents at a temperature sufficient to form volatile metal-ligand complexes on the surface of the device to be cleaned. The volatile metal-ligand complexes are then sublimed from the surface of the device providing a clean, substantially residue-free surface.

The cleaning agents according to the present invention comprise an effective amount of a partially halogenated or fully halogenated linear or branched carboxylic acid having from 2 to about 10 carbon atoms, the halogen being selected from fluorine or chlorine, wherein the cleaning agent and the metal-containing contaminants residing on the surface to be cleaned are capable of reacting to form volatile metal-ligand complexes. In a preferred embodiment, the carboxylic acid is a partially fluorinated or fully fluorinated linear or branched aliphatic carboxylic acid having from 2 to about 10 carbon atoms. A representative species is trifluoroacetic acid.

In an alternative embodiment, an effective amount of the cleaning agent is dispersed in an inert atmosphere including but not limited to nitrogen, argon or helium. In another embodiment, an effective amount of the cleaning agent is dispersed in an oxidizing atmosphere wherein the combination of the carboxylic acid and oxidizing atmosphere is capable of oxidizing the metal-containing contaminants residing on the surfaces of the substrate to their corresponding metal oxides, which thereafter, are capable of reacting with the enumerated cleaning agents to form volatile metal-ligand complexes. Suitable oxidizing atmospheres include, but are not limited to, oxygen, an oxygen-containing gaseous mixture, $N_2O$, HCl, HF, $F_2$, $Cl_2$ and $Br_2$.

Metal-containing contaminants can be removed from the surfaces of a broad range of substrates including silicon, silicon oxide, borophosphosilicate glass, phosphosilicate glass and strontium titanate. The process can be utilized to clean any substrate which is not capable of reacting with the cleaning agents under the enumerated process conditions. Metal-containing contaminants capable of being cleaned from the enumerated substrates include metal oxides represented by the formulae MO, $MO_2$, $MO_3$, $M_2O$ and $M_2O_3$ wherein M represents the metal of the respective metal oxide. Typical metals include copper, iron, nickel, chromium and gold. The process is also capable of cleaning metal-containing contaminants such as metal halides represented by the formula $M^{+n}(X^-)_n$ wherein n is 1, 2 or 3; X is a chlorine, bromine or iodine atom and M represents the metal of the respective metal halide. Representative metals include copper, aluminum, nickel, iron, itrium, manganese and chromium.

The invention offers numerous advantages over conventional wet-cleaning methods because the instant cleaning process can be conducted in-situ, meaning that the electronic device under fabrication does not have to be removed from the fabrication apparatus in order to clean metal-containing contaminants from the surfaces of the electronic device prior to conducting the next fabricating step. Moreover, the cleaning agents leave essentially no residue on the surface of the electronic assembly which might interfere with subsequent manufacturing steps or assembly performance.

BRIEF DESCRIPTION OF THE DRAWING

The drawing is a graphic description of the amount of cleaning achieved by the instant cleaning process.

DETAILED DESCRIPTION OF THE INVENTION

The present invention relates to a cleaning process for removing metal-containing contaminants from the surfaces of electronic devices such as semiconductors and integrated circuits between the numerous individual fabricating steps required to manufacture the electronic device. The invention offers numerous advantages over conventional wet-cleaning processes known in the art. The instant cleaning process can be conducted in-situ, meaning that the device being fabricated does not have to be removed from the fabricating apparatus in order to clean metal-containing contaminants from such surfaces prior to conducting the next fabricating step. Moreover, Applicants' cleaning agents leave essentially no residue on the surfaces of the device which might interfere with subsequent manufacturing steps.

The process according to the present invention employs a new class of cleaning agents comprising an effective amount of one or a mixture of two or more partially halogenated or fully halogenated, linear or branched carboxylic acids having from 2 to about 10 carbon atoms wherein the halogen is selected from fluorine or chlorine. Representative linear or branched carboxylic acids suitable to be treated with fluorine and or chlorine to replace some or all of the labile hydrogen atoms in the hydrocarbon portion of the carboxylic acid include acetic acid, propionic acid, butyric acid, isobutyric acid, tert-butyric acid and the linear and branched isomers of pentanoic acid, hexanoic acid, heptanoic acid, octanoic acid, nonanoic acid and decanoic acid.

In a preferred embodiment, the carboxylic acid is a partially fluorinated or fully fluorinated linear or branched aliphatic carboxylic acid. The preferred fully fluorinated carboxylic acid is trifluoroacetic acid (TFAA). For purposes or interpreting the Specification and Claims, the term, partially halogenated carboxylic acids, refers to carboxylic acids wherein one or more of the labile hydrogen atoms on the carbon chain of the carboxylic acid are substituted with a fluorine atom, a chlorine atom or a combination of fluorine and chlorine atoms. Therefore, the partially halogenated carboxylic acids may contain one or more fluorine atoms, one or more chlorine atoms, or a mixture of fluorine and chlorine atoms. The term, fully fluorinated carboxylic acid refers to carboxylic acids wherein each of the labile hydrogen atoms on the carbon chain of the carboxylic acid are substituted with a fluorine atom.

The partially halogenated and fully halogenated linear and branched carboxylic acids of the present invention can be prepared by methods well known in the art. Those skilled in the art will recognize that the volatility of each respective carboxylic acid will generally increase as the degree of halogenation increases. For example, trifluoroacetic acid is more volatile than difluoroacetic acid.

The term, effective amount, as applied to the cleaning agents of this invention, refers to that amount of the subject halogenated carboxylic acids required to obtain the desired cleaning activity. The effective amount of cleaning agent required to practice the claimed process is easily determined by those familiar with the art and will depend upon the manner in which the cleaning agent is delivered into the fabricating apparatus. Typical pressures generated by the ligands at temperatures between about 100° and 400° C. range from 10 torr to about 760 torr although the operating pressure is not critical to the practice of the invention.

In an alternate embodiment, an effective amount of the cleaning agent is dispersed in an inert atmosphere. Suitable inert atmospheres include nitrogen, argon and helium. The optimum amount will vary depending upon the particular cleaning ligand used, the metal-containing contaminants to be cleaned from the surface and the surface loading of the contaminant. Typical gas phase ligand concentrations range from 1.0% to about 100.0%, and preferably, from 5.0% to 25.0% of the desired ligand dispersed in the desired inert atmosphere.

In another embodiment, an effective amount of the cleaning agent is dispersed in an oxidizing atmosphere wherein the combination of the partially halogenated or fully halogenated carboxylic acid and oxidizing atmosphere is capable of oxidizing the metal-containing contaminants residing on the substrate's surfaces to their corresponding metal oxides. Typical gas phase ligand concentrations range from 1.0% to about 100.0%, and preferably from, 5.0% to 25.0% of the desired ligand dispersed in the desired oxidizing atmosphere. The resulting metal oxides are capable of reacting with the enumerated cleaning agents to form volatile metal-ligand complexes. Suitable oxidizing atmospheres include, but are not limited to, oxygen, an oxygen-containing gaseous mixture, $N_2O$, HCl, HF, $F_2$, $Cl_2$ and $Br_2$. An example of an oxygen-containing gaseous mixture is zero-grade air (a gaseous mixture containing about 19.5 to 23.5 mol percent oxygen and less than 0.5 mmole percent hydrocarbon, with the remainder comprising nitrogen, sold by Air Products and Chemicals, Inc., Allentown, PA).

The term, metal-ligand complexes, refers to the reaction product of the metal-containing contaminant and the halogenated carboxylic acid formed in-situ during the process. The volatile metal-ligand complexes residing on the surfaces of the electronic device or substrate are then sublimed from the surface providing a clean, substantially residue-free surface. The process substantially reduces the amount of metal-containing contaminants residing on the substrate's surfaces which can interfere with the depositing of conducting metals, etching steps and masking operations required to manufacture electronic devices.

The cleaning agents according to the present invention can be applied by both machine and manual operations known in the art. The particular cleaning agent to be utilized and the appropriate method for delivering the cleaning agents to the substrates to be cleaned will depend upon numerous factors including the properties of the electronic device, the type of metal-containing contaminants to be removed from the substrate's surface and the like. The term, cleaning agent refers to the enumerated halogenated carboxylic acids.

Applicants' process is capable of removing metal-containing contaminants from a broad range of substrates used in manufacturing electronic devices such as integrated circuits and semiconductors. Any substrate having metallic-containing surface contaminants wherein the substrate is not capable of reacting with the enumerated cleaning agents under the specified process operating conditions can be used in the present process. Representative substrates include, but are not limited to silicon, silicon oxide, borophosphosilicate glass, phosphosilicate glass and strontium titanate.

The instant cleaning process utilizing the cleaning agents disclosed herein can be used to remove numerous metal-containing contaminants. For purposes of interpreting the Claims, the invention contemplates any metal-containing contaminant which is capable of reacting with the cleaning agents of the present invention to form volatile metal-ligand complexes. Representative metal-containing contaminants include metal oxides represented by the formula MO, $MO_2$, $MO_3$, $M_2O$ and $M_2O_3$ wherein M represents the metal of the respective metal oxide. While M may represent a broad range of metals, representative metals include copper, iron, nickel, chromium and gold. The process is also capable of cleaning metal-containing contaminants such as metal halides represented by the formula $M^{+n}(X^-)_n$ wherein n is 1, 2 or 3; X is a chlorine, bromine or iodine atom and M represents the metal of the respective metal halide. Again, M represents a broad range of metals including copper, aluminum, nickel, iron, itrium, manganese and chromium.

While the instant process is particularly suited toward cleaning metallic films residing on the surfaces of electronic devices, the process can also be used for selectively cleaning one metallic film while maintaining the integrity of another metallic film residing on the substrate's surface. The selective process can be employed whenever two or more discrete metal-containing contaminants such as metal oxide films or metal halide films are present on the surface of a device wherein the reaction of the cleaning agent with a particular metal-containing contaminant occurs more rapidly than with the other contaminant residing of the substrate's surface.

The particular cleaning agent to be utilized and the appropriate method for delivering the cleaning agents to the surfaces to be cleaned of metal-containing contaminants depends upon numerous factors including the amount of metallic film to be cleaned, sensitivity of the electronic components to the cleaning agent, the desired time allotted for the cleaning process, the surface loading of the contaminant and the like.

In order to more fully describe the practice of the present process, a general embodiment of the cleaning process will now be presented. The substrate to be cleaned is placed in a heated chamber, such as a chemical vapor deposition chamber, commercial chemical vapor deposition furnace tube or commercial cleaning tool used in elevated temperature processes.

The substrate can also be left in the original process chamber, such a plasma etching reactor, provided that the chamber can be brought to the appropriate cleaning process temperature. The substrate is then heated to the desired temperature, typically from about 100° to 400° C. The desired cleaning agent is delivered to the electronic device to be cleaned by heating the cleaning agent to a temperature sufficient to create a sufficient operating vapor pressure. Alternately, the carboxylic acid may be dispersed in the desired oxidizing atmosphere or inert atmosphere and passed into the hot zone of the selected apparatus by conventional techniques.

The ligand may be continuously or intermittently delivered into the reactor or cleaning chamber. The process can also be conducted in one or more stages. For example, the metal-containing contaminants may be initially oxidized by subjecting the device to be cleaned to an enumerated oxidizing atmosphere followed by treating the device with the desired cleaning agent at a later time. Alternately, the process may be conducted in one stage wherein the cleaning agents react with metal-containing contaminants such as metal oxides and metal halides residing on the substrate's surface to form volatile metal-ligand complexes which are then conveniently sublimed from the surface to provide a substrate which is substantially residue free.

Metals in the zero oxidation state residing on the surface of the substrate may also be oxidized by reacting the metal with the halogenated carboxylic acid or the oxidizing atmosphere at elevated temperature to produce the corresponding metal oxides which then react with the ligands disclosed herein. These volatile metal-ligand complexes are conveniently sublimed from the surfaces of the device to produce a cleaned surface. The cleaning pattern can be conveniently controlled by masking operations known in the art wherein portions of the metallic surface which are not to be cleaned are covered with a material which will not react with the cleaning agent.

The cleaning agents of the present invention have been shown to react with metallic films comprising the oxides of copper, iron, nickel and chromium which typically reside on electronic devices during fabrication. The resulting metal-ligand complexes are sufficiently volatile such that following sublimation, essentially no residue remains on the substrate. Sublimation can also be assisted by pulling a partial or full vacuum on the device.

The above-mentioned embodiment represents a significant advance in gas-phase cleaning processes. This gas-phase cleaning process offers numerous advantages over conventional wet cleaning processes in that the above-mentioned ligands easily saturate an oxidizing or inert atmosphere and react exclusively with the metal oxides and metal halides of interest without the aid of a catalyst to form reaction products which are sufficiently volatile to leave essentially no residue on the surface of the device.

The instant cleaning process can be practiced at temperatures comensurate with those used in conventional cleaning processes. Typical temperatures for practicing the process range from about 100° to 400° C. The optimum reaction time and temperature for practicing the process will vary depending upon the particular ligand used, the type and quantity of metal-containing contaminant to be cleaned and the like. Typical processing time ranges from about 5 to 50 minutes depending upon contaminant loading of the surface.

The following example is provided to further illustrate an embodiment of the present invention and is not intended to restrict the scope of the invention. In the following example, temperatures are set forth uncorrected in degrees Celsius.

EXAMPLE

Cleaning of Metal-Containing Contaminants from a Silicon Surface using a Cleaning Agent Comprising Trifluoroacetic Acid Bare <100> silicon wafers (6 sq. in.) with native oxide were doped with metallic contaminants by standard evaporative techniques and were analyzed by Rutherford backscattering to determine the level of trace contaminants comprising iron, chromium, copper and nickel. Each wafer was scored and segmented into approximately one square inch regions. The wafers were placed at a 30 degree angle in a glass boat. Filtered zero grade air was bubbled through trifluoroacetic acid (PCR Inc., Gainesville, Fla.) at a rate of 83 sccm or 15% trifluoroacetic acid in the process stream. The trifluoroacetic acid was delivered to a glass tube heated to 200° C., and the wafers were exposed to the cleaning agent for about 40 minutes. The results are shown in the FIGURE wherein the amount of cleaning achieved by the instant cleaning process is graphically depicted. The results are presented in numerical form in the Table. Rutherford Backscattering analysis provides a detection limit of about $0.5 \times 10^{-13}$ atoms/sq. cm.

TABLE

| CLEANING OF SILICON SUBSTRATE WITH TRIFLUOROACETIC ACID CLEANING AGENT | | | | |
| --- | --- | --- | --- | --- |
|  | Fe | Cr | Cu | Ni |
| Initial Level | 7.99 | 7.01 | 3.45 | 5.31 |
| Final Level (200° C.) | 7.01 | 6.35 | 0.48 | 7.0 |
| Final Level (300° C.) | 2.8 | 6.09 | 0.23 | 4.97 |

The results according to the FIGURE and Table demonstrate that at 300° C., the cleaning agent comprising trifluoroacetic acid effectively removed substantially all of the copper-containing contaminants from the surface while removing about 40% of the iron-containing contaminants. In contrast, small amounts of chromium- or nickel-containing contaminants were removed at the specified reaction temperature. The term, diffusion, presented in the FIGURE, refers to a control experiment wherein zero-grade air, in the absence of TFAA, was passed over the silicon wafer.

Further experiments indicate that higher temperatures must be utilized to effect removal of chromium- and nickel-containing contaminants from the surfaces of the enumerated substrates. Thus, a process for selectively removing one metal-containing contaminant from the surface of a device having two or more discrete metal-containing contaminants can be achieved by merely selecting the appropriate cleaning agent and controlling the process temperature and pressure of the cleaning agent.

The present vapor-phase cleaning process for removing metal-containing contaminants from the surfaces of electronic devices during their fabrication offers numerous advantages over typical wet cleaning methods known in the art. The instant cleaning process can be conducted in the vapor-phase thereby eliminating the necessity for exposing the substrate to the clean room environment during apparatus transfer. Recontamination via exposure to other contaminants is thereby avoided. Moreover, the cleaning agents leave essentially no residue on the surface of the electronic assembly which might later interfere with subsequent manufacturing steps and device performance.

Having thus described the present invention, what is now deemed appropriate for Letters Patent is set out in the following appended claims.

We claim:

1. A process for cleaning metal-containing contaminants from a surface of a substrate of the type used in fabricating integrated circuits and semiconductors comprising contacting the surface with a cleaning agent comprising an effective amount of a partially halogenated or fully halogenated linear or branched carboxylic acid having from 2 to about 10 carbon atoms, the halogen atom being independently selected from fluorine or chlorine, in the vapor phase at a temperature sufficient to form a volatile metal-ligand complex and subliming the metal-ligand complex to remove the metal contaminants and provide a clean surface.

2. The process according to claim 1 wherein the substrate to be cleaned is selected from silicon, silicon oxide, borophosphosilicate glass, phosphosilicate glass and strontium titanate.

3. The process according to claim 2 wherein the metal-containing contaminants to be cleaned from the surface of the substrate comprise a metal oxide represented by the formulae $MO$, $MO_2$, $MO_3$, $M_2O$ and $M_2O_3$ wherein M represents the metal of the metal oxide.

4. The process according to claim 1 wherein the metal-containing contaminant comprises a metal halide represented by the formula $M^{+n}(X^-)_n$ wherein n is 1, 2 or 3, X is a chlorine, bromine or iodine atom and M represents the metal of the metal halide.

5. A process for cleaning metal-containing contaminants from a surface of a substrate of the type used in fabricating integrated circuits and semiconductors comprising contacting the surface with a cleaning agent comprising an effective amount of a partially fluorinated or fully fluorinated linear or branched aliphatic carboxylic acid having from 2 to about 10 carbon atoms, in the vapor phase at a temperature sufficient to form a volatile metal-ligand complex and subliming the metal-ligand complex to remove the metal contaminants and provide a clean surface.

6. The process according to claim 5 wherein the cleaning agent is trifluoroacetic acid.

7. The process according to claim 6 wherein the substrate to be cleaned is selected from silicon, silicon oxide, borophosphosilicate glass, phosphosilicate glass and strontium titanate.

8. The process according to claim 7 wherein the metal-containing contaminants to be cleaned from the surface of the substrate comprise a metal oxide represented by the formulae $MO$, $MO_2$, $MO_3$, $M_2O$ and $M_2O_3$ wherein M represents the metal of the metal oxide.

9. The process according to claim 8 wherein the metal-containing contaminant comprises an oxide of a metal selected from the group consisting of copper, iron, nickel, chromium and gold.

10. The process according to claim 9 wherein the metal is copper.

11. The process according to claim 6 wherein the metal-containing contaminant comprises a metal halide represented by the formula $M^{+n}(X^-)_n$ wherein n is 1, 2 or 3, X is a chlorine, bromine or iodine atom and M represents the metal of the metal halide.

12. The process according to claim 11 wherein the metal, M, of the metal halide is selected from the group consisting of copper, aluminum, nickel, iron, itrium, manganese and chromium.

13. The process according to claim 12 wherein the metal is copper.

14. The process according to claim 1 wherein the carboxylic acid is a partially halogenated or fully halogenated, linear or branched aliphatic carboxylic acid.

15. The process according to claim 1 wherein the carboxylic acid is dispersed in an oxidizing atmosphere.

16. The process according to claim 15 wherein the oxidizing atmosphere is selected from the group consisting of oxygen gas, an oxygen-containing gas, $N_2O$, HCl, HF, $Cl_2$, $Br_2$ and $F_2$.

17. The process according to claim 1 wherein the carboxylic acid is dispersed in an inert atmosphere.

18. The process according to claim 5 wherein the carboxylic acid is a partially halogenated or fully halogenated, linear or branched aliphatic carboxylic acid.

19. The process according to claim 5 wherein the carboxylic acid is dispersed in an oxidizing atmosphere.

20. The process according to claim 19 wherein the oxidizing atmosphere is selected from the group consisting of oxygen gas, an oxygen-containing gas, $N_2O$, HCl, HF, $Cl_2$, $Br_2$ and $F_2$.

21. The process according to claim 5 wherein the carboxylic acid is dispersed in an inert atmosphere.

* * * * *